(12) United States Patent
Kim et al.

(10) Patent No.: US 12,205,779 B2
(45) Date of Patent: Jan. 21, 2025

(54) SELF-POWERED WIRELESS SWITCH

(71) Applicant: Wonju Yang, Gyeonggi-do (KR)

(72) Inventors: Sun Young Kim, Gyeonggi-do (KR); Hyung Jin Choi, Incheon (KR)

(73) Assignee: Wonju Yang, Gyeongsangnam-do (KR)

( * ) Notice: Subject to any disclaimer, the term of this patent is extended or adjusted under 35 U.S.C. 154(b) by 0 days.

(21) Appl. No.: 17/791,791

(22) PCT Filed: Jan. 6, 2021

(86) PCT No.: PCT/KR2021/000127
§ 371 (c)(1),
(2) Date: Jul. 8, 2022

(87) PCT Pub. No.: WO2021/141380
PCT Pub. Date: Jul. 15, 2021

(65) Prior Publication Data
US 2023/0052861 A1    Feb. 16, 2023

(30) Foreign Application Priority Data

Jan. 9, 2020 (KR) .................. 10-2020-0003079
Nov. 13, 2020 (KR) .................. 10-2020-0152231

(51) Int. Cl.
*H01H 13/14*    (2006.01)
*H01H 13/04*    (2006.01)
(Continued)

(52) U.S. Cl.
CPC ............ *H01H 13/14* (2013.01); *H01H 13/04* (2013.01); *H01H 13/20* (2013.01); *H01H 13/26* (2013.01);
(Continued)

(58) Field of Classification Search
CPC ........ H01H 13/04; H01H 13/14; H01H 13/20; H01H 13/26; H01H 13/54; H10N 30/30; H05B 47/19
(Continued)

(56) References Cited

U.S. PATENT DOCUMENTS 7,692,559 B2 *  4/2010  Face .................... H03K 17/965
                                                             341/20

FOREIGN PATENT DOCUMENTS

CN    105281534 A    1/2016
CN    208284413 U    12/2018
(Continued)

OTHER PUBLICATIONS

International Search Report for PCT/KR2021/000127 mailed on May 7, 2021.

*Primary Examiner* — Anthony R Jimenez
(74) *Attorney, Agent, or Firm* — The PL Law Group, PLLC

(57) ABSTRACT

A self-power wireless switch according to an embodiment of the present invention includes a lower body, an upper body rotatably coupled, through a rotating shaft, to one side of the lower body; a switch cover rotatably coupled to one side of the lower body, or rotatably coupled to one side of an upper cover, a switch member capable of contacting the switch cover, a printed circuit board (PCB) comprising a contact unit which may contact the switch member that has been pressed by a user, and a generator positioned at the lower surface of the PCB and supplying power to the PCB. When the user presses the switch cover, the upper body rotates, and pressure is applied to a generator bar formed on the generator, and thus power is generated.

7 Claims, 10 Drawing Sheets

(51) Int. Cl.
    *H01H 13/20*    (2006.01)
    *H01H 13/26*    (2006.01)
    *H01H 13/54*    (2006.01)
    *H05B 47/19*    (2020.01)
    *H10N 30/30*    (2023.01)

(52) U.S. Cl.
    CPC ............ *H01H 13/54* (2013.01); *H05B 47/19* (2020.01); *H10N 30/30* (2023.02)

(58) Field of Classification Search
    USPC .......................................................... 200/237
    See application file for complete search history.

(56) References Cited

FOREIGN PATENT DOCUMENTS

| | | | |
|---|---|---|---|
| CN | 110033969 | A | 7/2019 |
| KR | 10-1494437 | B1 | 2/2015 |
| KR | 10-1987929 | B1 | 6/2019 |
| KR | 10-2019-0142276 | A | 12/2019 |

\* cited by examiner

SELF-POWERED WIRELESS SWITCH

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/KR2021/000127, filed Jan. 6, 2021, which claims priority to the benefit of Korean Patent Application Nos. 10-2020-0003079 filed in the Korean Intellectual Property Office on Jan. 9, 2020 and 10-2020-0152231 filed in the Korean Intellectual Property Office on Nov. 13, 2020, the entire contents of which are incorporated herein by reference.

BACKGROUND

1. Technical Field

Embodiments of the present invention relate to a self-power wireless switch.

2. Background Art

In general, a wiring switch is a mechanism for connecting or blocking electricity to electric device such as lightings or home appliances in indoor wirings, and a button type is being widely used.

Such a wiring switch is installed on a wall or the like in a manner, in which one button is connected to an electric circuit to control turn-on/off of one electric appliance, or is installed in a manner, in which a plurality of buttons are connected in parallel to one electric circuit to selectively control turn-on/off of a plurality of electric appliance.

However, a self-power wireless switch that generates power for a switch operation through self-power generation without an external power supply in order to solve inconvenience of burying and installing a push button in the wall or inconvenience of replacing a battery therein.

However, in the case of the self-power wireless switch according to the related art, noise is generated during a switch push operation, and the operation is not smooth when the switch is pressed, and thus, excessive force is required when a user presses the button.

In addition, the self-power wireless switch according to the related art requires a plurality of components for constituting the self-power wireless switch and complicated in shape to increase in manufacturing cost.

SUMMARY

Embodiments of the present invention are to provide a self-power wireless switch in which feeling of a button operation is softened to be pressed by a user such as the weak and the elderly with little force when the switch is pressed.

In addition, embodiments of the present invention are to provide a self-power wireless switch that is simplified in components constituting the switch and is formed with even a simple structure.

In addition, embodiments of the present invention are to provide a self-power wireless switch in which a switch member for controlling a plurality of electric appliances is easily expanded.

According to an embodiment of the present invention, provided is a self-power wireless switch including: a lower body; an upper body rotatably coupled to one side of the lower body through a rotating shaft; a switch cover coupled to the lower body or an upper cover, wherein the switch cover is rotatably coupled to one side of the lower body or an upper cover; a switch member capable of being in contact with the switch cover; a printed circuit board (PCB) including a contact unit which is in contact with the switch member pressed by a user; and a generator disposed on a bottom surface of the PCB and supplying power to the PCB, wherein, when the user presses the switch cover, while the upper body rotates, a pressure is applied to a generator bar disposed on the generator to generate power.

A pressing member may be disposed inside the lower body, and when the upper body rotates, the pressing member may apply the pressure to the generator bar.

The pressing member may have a shape that protrudes upward from the lower body.

An elastic member may be disposed between the generator bar and the upper body.

The elastic member may include a torsion spring.

The contact unit of the printed circuit board may be provided in number corresponding to pressing positions of the plurality of switch members.

When the switch member is pressed, the upper body may rotate about the rotating shaft.

A distance between the switch member and the rotating shaft may be greater than that between the generator bar and the rotating shaft.

According to the embodiments of the present invention, when the self-power wireless switch is pressed, the operation feeling is softened by using the lever principle based on the rotating shaft formed at one side of the lower body so that the user may press the self-power wireless switch with the little force.

In addition, according to the embodiments of the present invention, since the switch member, the printed circuit board, and the self-power generator are disposed on the upper body, the components may be simplified, and the self-power wireless switch may have the simple structure at the low cost.

DETAILED DESCRIPTION

Hereinafter, embodiments of the present invention will be described in detail with reference to the accompanying drawings. The following detailed descriptions are provided to help comprehensive understanding of a method, an apparatus, and/or a system described in this specification. However, this is merely an example, and the present invention is not limited thereto.

In descriptions of embodiments of the present invention, detailed descriptions related to the well-known technologies will be ruled out in order not to unnecessarily obscure subject matters of the present invention. Also, terms used in the present specification are terms defined in consideration of functions according to embodiments, and thus the terms may be changed according to the intension or usage of a user or operator. Therefore, the terms should be defined on the basis of the overall contents of this specification. The terms used in the present specification are merely used to describe particular embodiments, and are not intended to limit the present invention. An expression used in the singular encompasses the expression in the plural, unless it has a clearly different meaning in the context. In the present specification, it is to be understood that terms such as "including" or "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 1:
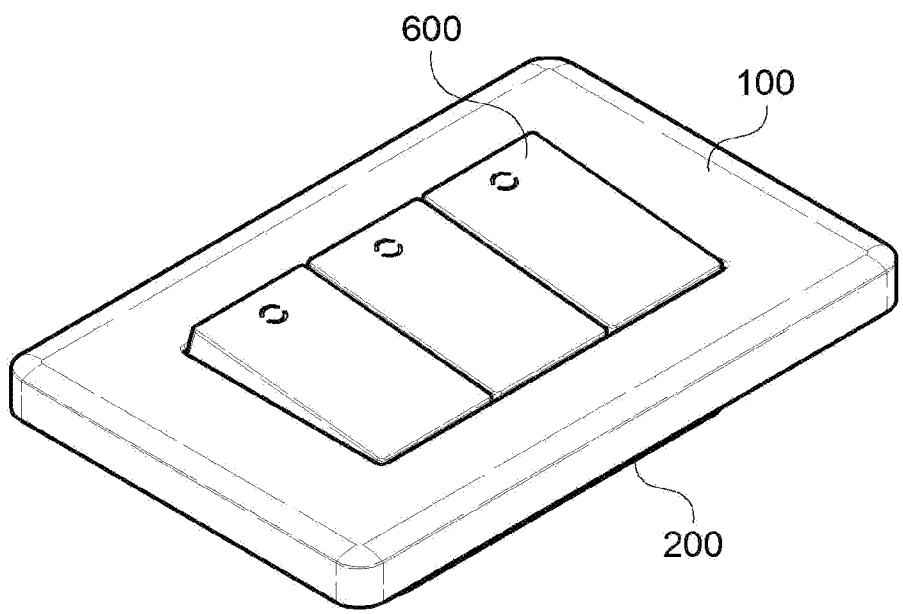
FIG. 1 is a perspective view illustrating an outer appearance of a self-power wireless switch according to an embodiment of the present invention.
Figure 2:
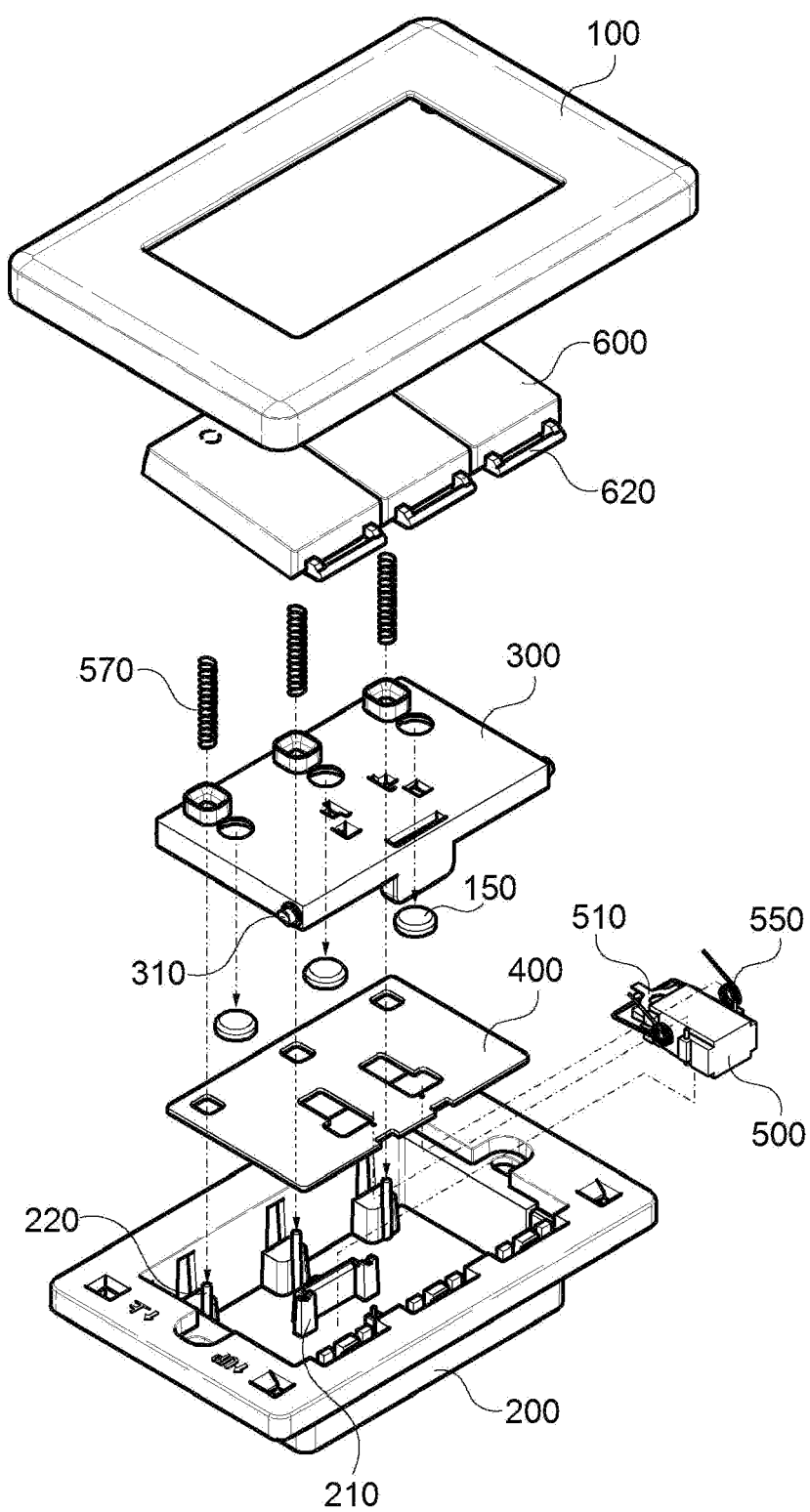
FIG. 2 is an exploded perspective view illustrating the self-power wireless switch of FIG. 1.
Figure 3:
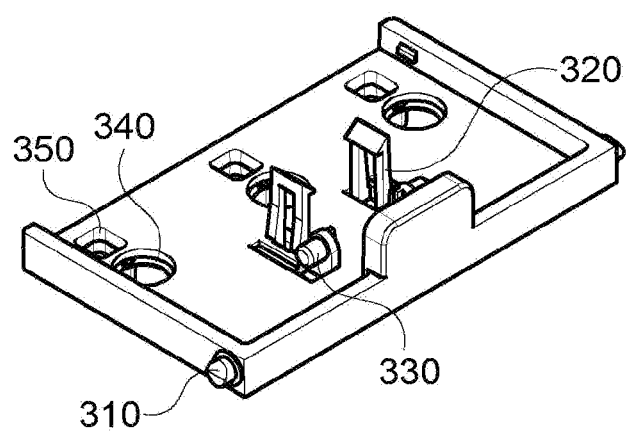
FIG. 3 is a view illustrating a lower side of an upper body of the self-power wireless switch.

FIG. 1 is a perspective view illustrating an outer appearance of a self-power wireless switch 10 according to an embodiment of the present invention, FIG. 2 is an exploded perspective view illustrating the self-power wireless switch 10 of FIG. 1, and FIG. 3 is a view illustrating a lower side of an upper body 300 of the self-power wireless switch 10.

Referring to FIGS. 1 to 3, the self-power wireless switch 10 may include an upper cover 100 and a lower body 200 and is provided with a switch cover 600 exposed from the upper cover 100. The switch cover 600 may be provided in plurality to turn on/off a plurality of electrical appliances. Each of the upper cover 100, the lower body 200, and the switch cover 600 may be made of plastic having rigidity. When the switch cover 600 is pressed, a switch member 150 disposed inside the self-power wireless switch 10 may be pressed. The switch member 150 may have conductivity while having elasticity, and thus, when the switch member 150 is in contact with a contact unit 410 of a printed circuit board 400, the switch member 150 is electrically conducted. For this, a side of the switch member 150, which is in contact with at least the contact unit 410, may be made of carbon or other materials. When the switch cover 600 is pressed, the upper body 300 and the printed circuit board 400 may apply a pressure to a generator bar 510 of an internal generator while rotating by the switch cover 600. The switch cover 600 may include a coupling member 620 to be rotatably coupled to one side of the lower body 200. Thus, when the user presses the switch cover 600, the pressing of the switch cover 600 may be transmitted to the upper body 300 and the printed circuit board 400 through the switch member 150. In addition, the upper body 300 may rotate with respect to the lower body 200 based on the rotating shaft 310 formed on the upper body 300. The switch cover 600 may not be coupled to the lower body 200, but be coupled to one side of the upper cover 100, which will be described later as another embodiment.

The switch member 150 may have a plurality of pressing positions so that the user turns on/off a desired mechanism. For example, the switch member 150 may have a plurality of pressing positions that correspond to a plurality of lighting devices, respectively. Thus, a specific lighting fixture among a plurality of lighting devices may be turned on and off according to which one of the plurality of pressing positions is pressed. However, the self-power wireless switch 10 may be connected to various electric appliances as well as lighting devices to turn on and off the corresponding electric appliance (e.g., air conditioners, televisions, home appliances such as set-top boxes).

A printed circuit board (PCB) 400 capable of transmitting an on/off signal to a desired electronic appliance and a generator 500 that supplies power to the printed circuit board 400 to perform an on/off operation may be disposed below the upper body 300. The generator 500 may include a piezoelectric element to generate power when a pressure is applied to a generator bar 510. In the case of the self-power wireless switch 10 according to an embodiment of the present invention, when the upper body 300 rotates together with the switch cover 600 based on the rotating shaft 310 by the user's pressing force, the generator bar 510 may be pressed to generate the power in the generator 500.

A contact unit (not shown) that is in contact with the switch member 150 may be disposed on the printed circuit board 400 when the switch member 150 is pressed. When the switch member 150 is in contact with the contact unit 410, the on/off signal may be transmitted to the electric appliance corresponding to the corresponding position. When a plurality of pressing positions are formed on the switch member 150, a plurality of contact units corresponding to the plurality of pressing positions may also be formed on the printed circuit board 400. Thus, when the user presses a specific pressing position, the on/off signal may be transmitted to an appropriate electric appliance according to the corresponding contact unit. The contact unit may be made of carbon or other materials to have durability and corrosion resistance in spite of the multiple contact of the switch member 150. According to an embodiment of the present invention, since the contact unit of the printed circuit board 400 is in direct contact with the switch member 150, it may be easy to expand the pressing position between the contact unit and the switch member 150. That is, a pattern for forming the contact unit on the printed circuit board 400 may be freely formed, and also, the pressing position of the switch member 150 may be formed at each corresponding position to freely expand the number of electronic appliances that are capable of being controlled in one self-power wireless switch 10.

When the user presses the switch cover 600, and the upper body 300 rotates with respect to the lower body 200 and then releases the user's hand, an elastic member 550 may be disposed so that the upper body 300 returns to its original state. The elastic member 550 may be disposed between the upper body 300 (or the printed circuit board 400) and the generator bar 510 to allow the upper body 300 to return to its original state when the user releases the user's hand. The elastic member 550 may be a torsion spring in which elasticity is generated by torsion. The elastic member 550 may include a spring bar 551 supported to a side of the upper body and sides of the generator bar 510 and the pressing member 210 and a torsion part 552 fitted into a connection bar 331 of an elastic member connection member 330 of the upper body 300 while generating torsional electricity therebetween.

The pressing member 210 corresponding to the generator bar 510 may be disposed inside the lower body 200. The pressing member 210 may have a shape protruding upward from the lower body 200. The pressing member 210 may apply a pressure to the generator bar 510 by pressing the generator bar 510 when the upper body 300 is pressed. As the pressing member 210 applies the pressure to the generator bar 510, the generator 500 may generate power.

Figure 4A:
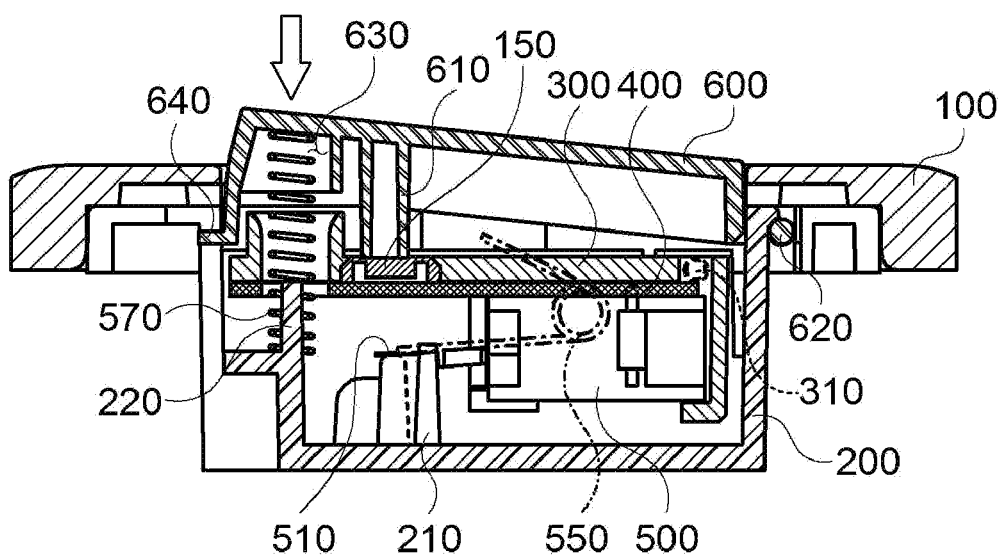
FIGS. 4A and 4B are views for explaining an operation of the self-power wireless switch according to an embodiment of the present invention.
Figure 4B:
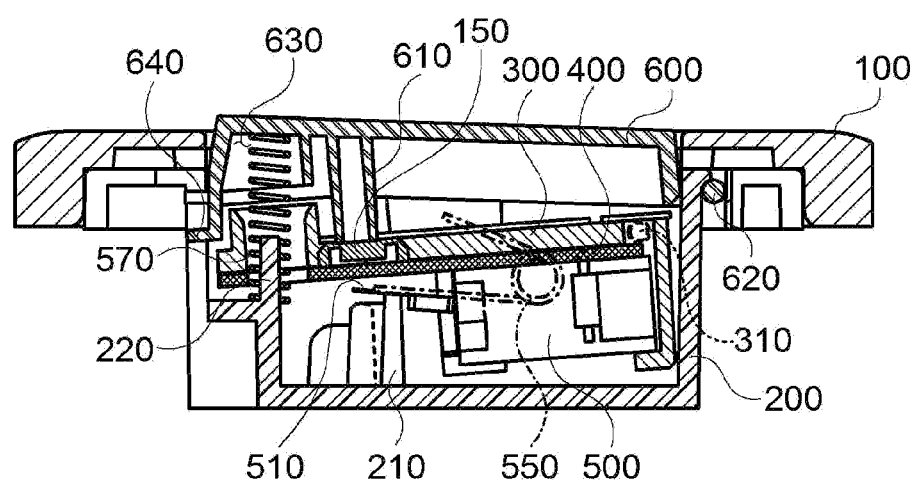

FIGS. 4A and 4B are views for explaining an operation of the self-power wireless switch according to an embodiment of the present invention.

Referring to FIGS. 4A and 4B, the self-power wireless switch 10 may include a switch cover 600, and the switch member 150 pressed by the pressing member 610 of the switch cover 600 may have a shape that is in contact with the contact unit of the printed circuit board 400. The printed circuit board 400 may be coupled to the upper body 300, and the upper body 300 may rotate by the rotating shaft 310. The generator 500 may be disposed on a bottom surface of the printed circuit board 500, and when a pressure is applied to the generator bar 510, the power may be generated to be supplied to the printed circuit board 400. A through-part (see reference numeral 340 in FIG. 3) for the switch member may be formed in the upper body 300 so that the pressing member 610 presses the switch member 150 disposed on the printed circuit board 500.

The user may press one switch cover 600 corresponding to a desired electrical appliance among the plurality of switch covers 600. As the switch cover 600 is pressed, the contact unit disposed at a position corresponding to the switch member 150 on the printed circuit board 400 may be in contact with the switch member 150. According to the number of switch members 150, the number of contact units 410 may also be provided to correspond to the number of switch members 150, and the user may allow the contact unit corresponding to the switch member 150 of the switch cover 600 to be in contact with the switch member 150.

The upper body 300 may rotate about the rotating shaft 310 by the user's force pressing the switch cover 600 so as to be inclined toward the lower body 200. Since the printed circuit board 400 and the generator 500 are coupled to the lower side of the upper body 300, the printed circuit board 400 and the generator 500 may be inclined together with the upper body 300.

When the upper body 300 is inclined toward the lower body 200, the generator bar 510 of the generator 500 may be pressed by the pressing member 210 disposed on the lower body 200. When the generator bar 510 is deformed by being pressed by the pressing member 210, power may be generated in the generator 500. The generated power may be used to transmit the on/off signal from the printed circuit board 400 to the corresponding electric appliance.

When the user stops the pressing with respect to the switch member 150, the elastic member 550 may function of allowing the generator bar 510 and the upper body 300 to return to their original states. As the elastic member 550 pushes the upper body 300 upward while allowing the generator bar 510 to turn to its original position, the upper body 300 may return to its original position.

In addition, an auxiliary elastic member 570 may be separately disposed between an accommodation part 630 of the switch cover 600 and an elastic member support part 220 of the lower body 200. The auxiliary elastic member 570 may provide restoring force for allowing the switch cover 600 to return to its original state. The elastic member support part 220 may have, for example, a column shape into which the auxiliary elastic member 570 that is provided in the form of a coil, is inserted. In addition, a through-hole (see reference numeral 350 in FIG. 3) may be defined in the upper body 300 to allow the auxiliary elastic member 570 to pass therethrough.

In the self-powering switch 10 according to an embodiment of the present invention, it is possible to provide the self-power wireless switch 10 with smooth operation feeling by the structure described above. Particularly, since a distance between the switch member 150 and the rotating shaft 310, which corresponds to a position, at which the user presses, is greater than a distance between the generator bar 510 generating power and the rotating shaft 310, the user may operate the generator 500 with little force through a lever principle, and thus, the smooth operation feeling may be obtained.

In addition, the printed circuit board 400 and the generator 500 are disposed below the upper body 300, a configuration for operating the generator 500 may be minimized, and the self-power wireless switch 10 may be configured with a simple configuration. Also, since the switch member 150 and the printed circuit board 400 are in direct contact with each other, the desired number of contact units 410 may be provided on the printed circuit board 400 to easily expand an electronic appliance capable of being controlled through one self-power wireless switch 10.

Figure 5:
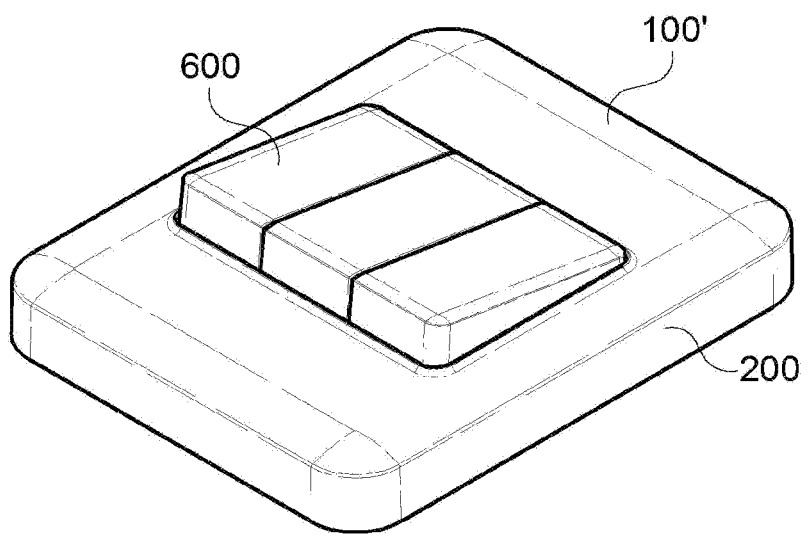
FIG. 5 is a perspective view illustrating an outer appearance of a self-power wireless switch according to another embodiment of the present invention.
Figure 6A:
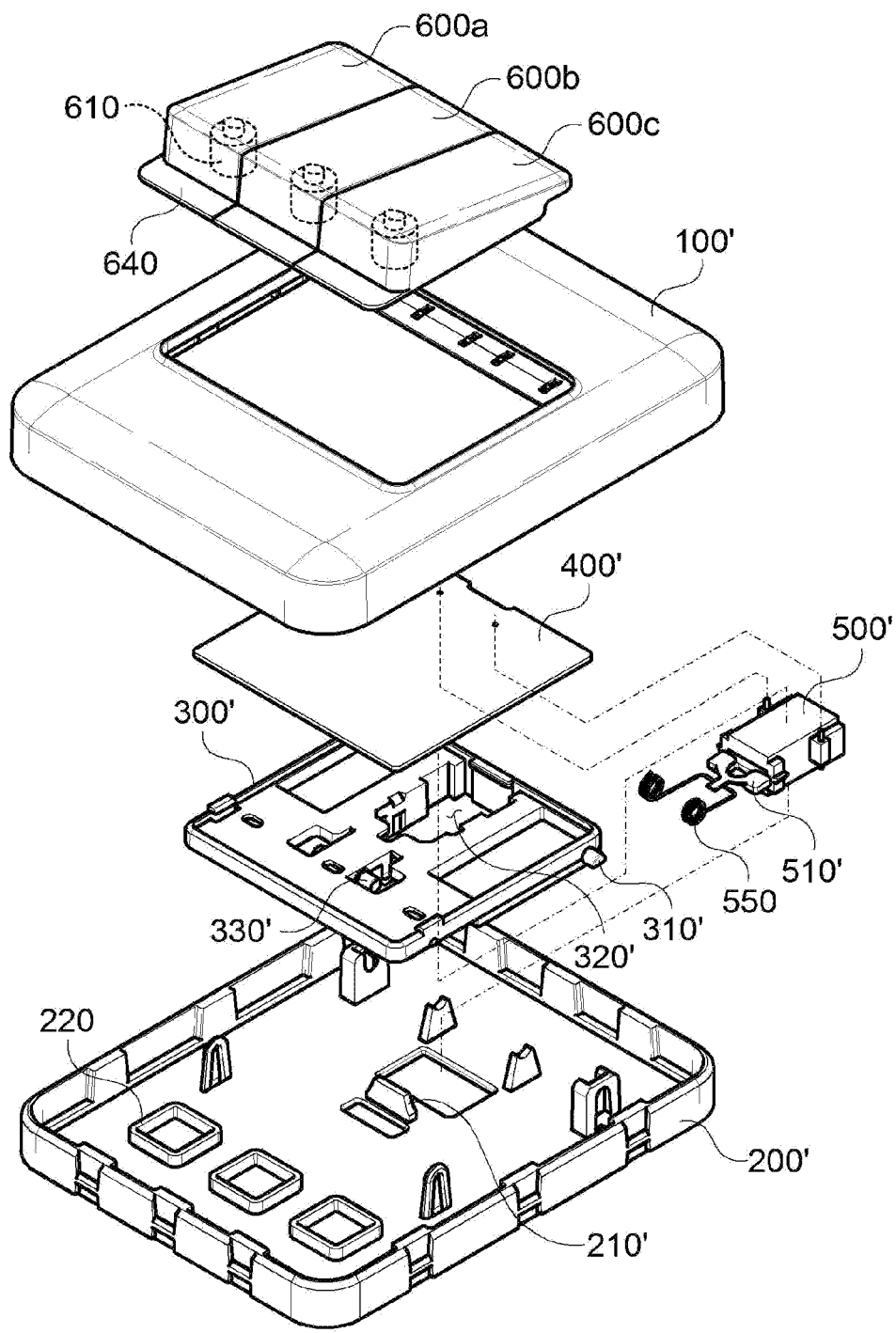
FIG. 6A is an exploded perspective view of the self-power wireless switch of FIG. 4.
Figure 6B:
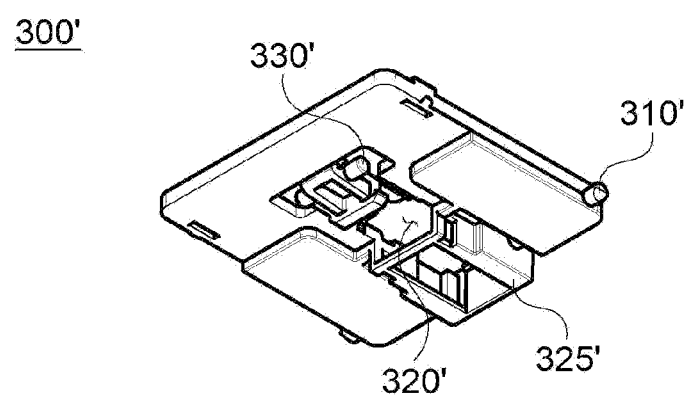
FIG. 6B is a view illustrating a lower side of an upper body of the self-power wireless switch.

FIG. 5 is a perspective view illustrating an outer appearance of a self-power wireless switch 11 according to another embodiment of the present invention, and FIG. 6A is an exploded perspective view of the self-power wireless switch 11 of FIG. 4, and FIG. 6B is a view illustrating a lower side of an upper body 300' of the self-power wireless switch 11.

Figure 7A:
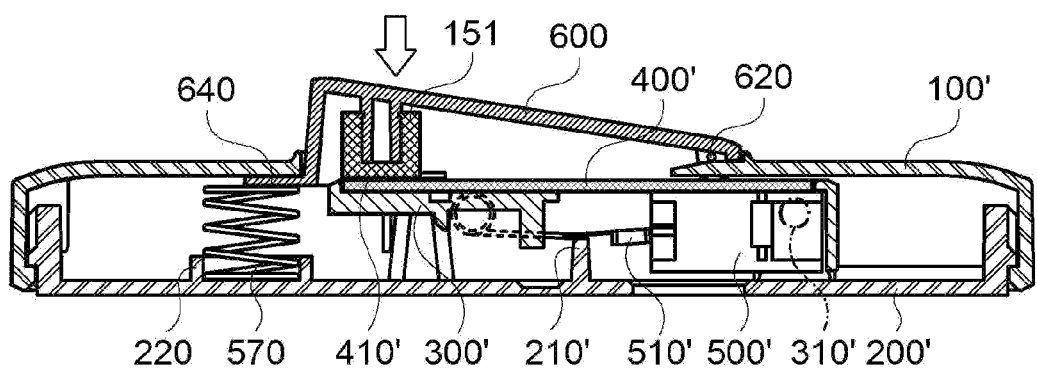
FIGS. 7A and 7B are views for explaining an operation of the self-power wireless switch of FIG. 5.
Figure 7B:
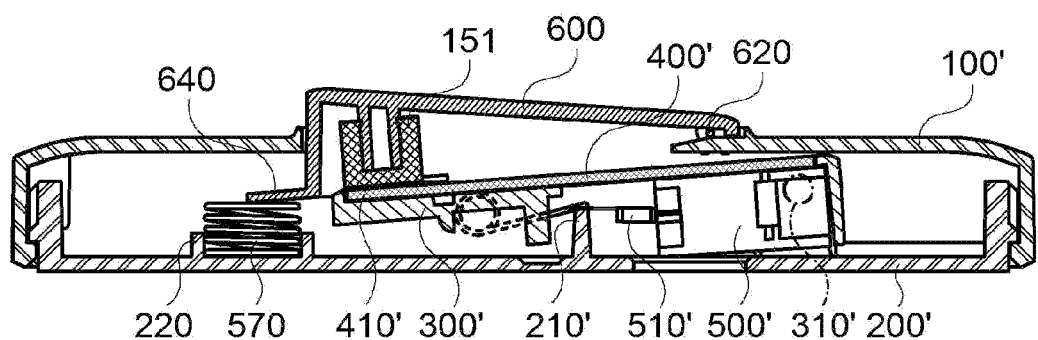

Referring to FIGS. 5 and 6A to 6B, unlike the foregoing embodiment, in the self-power wireless switch 11 according to this embodiment, a switch cover 600 disposed above a switch member 151 may be connected to a side of an upper cover 100 through a coupling member (see reference numeral 620 of FIG. 7A or FIG. 7B). Likewise, when a user presses the switch cover 600, the upper body 300' and a printed circuit board 400' may apply a pressure to a generator bar 510 of an internal generator while rotating by the switch cover 600. The switch cover 600 is rotatably coupled to one side of the upper cover 100. Thus, when the user presses the switch cover 600, the pressing of the switch cover 600 may be transmitted to the upper body 300' and the printed circuit board 400' through the switch member 151. In addition, a rotating shaft 310 may be disposed at one side of a lower body 200 so that the upper body 300' rotates with respect to the lower body 200 about the rotating shaft 310.

FIGS. 7A and 7B are views for explaining an operation of the self-power wireless switch 11 of FIG. 5.

Referring to FIGS. 7A and 7B, the self-power wireless switch 11 may include the switch cover 600 and may have a shape, in which the switch member 151 into which a protrusion 610 of the switch cover 600 is inserted and coupled is in contact with a contact unit 410'. In this embodiment, the printed circuit board 400 may be coupled to the upper body 300', and the upper body 300 may rotate by the rotating shaft 310'. This embodiment is the same as the foregoing embodiment in that the generator 500' is disposed on a bottom surface of the printed circuit board 400', and when a pressure is applied to the generator bar 510, the power is generated to be supplied to the printed circuit board 400'.

Also, in this embodiment, when the switch cover 600 is pressed, a generator 510' of the generator 500' may have the pressure by a pressing member 210' while the printed circuit board 400 rotates. For this, an auxiliary elastic member 570 may be separately disposed between a bottom surface portion 640 of the switch cover 600 and an elastic member support part 220 of the lower body 200. That is, the auxiliary elastic member 570 may provide restoring force for allowing the switch cover 600 to return to its original state. However, the auxiliary elastic member 570 may not be a necessary configuration and thus may be omitted.

Although the present invention has been described in detail through representative examples above, those of ordinary skill in the art to which the present invention pertains will understand that various modifications can be made to the above-described embodiments without departing from the scope of the present invention. Therefore, the scope of this disclosure is defined not by the detailed description of the invention but by the appended claims, and all differences within the scope will be construed as being included in the present invention.

What is claimed is:

1. A self-powered wireless switch comprising:
   a lower body;
   an upper body rotatably coupled to one side of the lower body through a rotating shaft;
   an upper cover;
   a switch cover coupled to the lower body or the upper cover, wherein the switch cover is rotatably coupled to one side of the lower body or the upper cover;
   a switch member configured to be in contact with the switch cover;
   a printed circuit board (PCB) comprising a contact unit which is to be in contact with the switch member pressed by a user;
   a generator coupled to a bottom surface of the PCB and configured for supplying power to the PCB;
   a generator bar disposed on the generator; and
   a pressing member disposed inside the lower body,
   wherein, when the user presses the switch cover, while the upper body, the PCB and the generator rotate together, a pressure is applied to the generator bar by the pressing member to generate power.

2. The self-powered wireless switch of claim 1, wherein the pressing member has a shape that protrudes upward from the lower body.

3. The self-powered wireless switch of claim 1, wherein the contact unit of the printed circuit board is provided in the number corresponding to pressing positions of the plurality of switch members.

4. The self-powered wireless switch of claim 1, wherein, when the switch member is pressed, the upper body is configured to rotate about the rotating shaft.

5. The self-powered wireless switch of claim 1, wherein a distance between the switch member and the rotating shaft is greater than that between the generator bar and the rotating shaft.

6. The self-powered wireless switch of claim 1, further comprising an elastic member disposed between the generator bar and the upper body.

7. The self-powered wireless switch of claim 6, wherein the elastic member comprises a torsion spring.

* * * * *